(12) United States Patent
Hiraoka et al.

(10) Patent No.: US 11,581,148 B2
(45) Date of Patent: Feb. 14, 2023

(54) THIN FILM CAPACITOR, CIRCUIT BOARD INCORPORATING THE SAME, AND THIN FILM CAPACITOR MANUFACTURING METHOD

(71) Applicant: TDK CORPORATION, Tokyo (JP)

(72) Inventors: Masahiro Hiraoka, Tokyo (JP); Mitsuhiro Tomikawa, Tokyo (JP); Hitoshi Saita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 38 days.

(21) Appl. No.: 17/165,498

(22) Filed: Feb. 2, 2021

(65) Prior Publication Data

US 2021/0257164 A1    Aug. 19, 2021

(30) Foreign Application Priority Data

Feb. 13, 2020 (JP) ............... JP2020-022265

(51) Int. Cl.
| | | |
|---|---|---|
| *H01G 4/33* | (2006.01) | |
| *H01G 4/008* | (2006.01) | |
| *H01G 4/08* | (2006.01) | |
| *H05K 3/38* | (2006.01) | |
| *H05K 1/03* | (2006.01) | |
| *H01G 4/30* | (2006.01) | |

(52) U.S. Cl.
CPC ............... *H01G 4/33* (2013.01); *H01G 4/008* (2013.01); *H01G 4/08* (2013.01); *H01G 4/30* (2013.01); *H05K 1/0306* (2013.01); *H05K 3/388* (2013.01); *H05K 2201/0179* (2013.01)

(58) Field of Classification Search
None
See application file for complete search history.

(56) References Cited

U.S. PATENT DOCUMENTS

| | | | | |
|---|---|---|---|---|
| 5,185,690 A | * | 2/1993 | Miller | H05K 1/162 361/321.2 |
| 9,307,643 B2 | * | 4/2016 | Nakagome | H01L 23/13 |
| 2007/0097596 A1 | * | 5/2007 | Kuwajima | H01G 4/01 361/311 |
| 2007/0117338 A1 | * | 5/2007 | Yamamoto | H05K 1/186 257/E23.079 |
| 2007/0121273 A1 | * | 5/2007 | Yamamoto | H01G 4/232 257/E23.07 |

(Continued)

FOREIGN PATENT DOCUMENTS

| | | | | | |
|---|---|---|---|---|---|
| JP | | 3756041 B2 | * | 3/2006 | ......... H01L 23/5384 |
| JP | | 2010027948 A | | 2/2010 | |

*Primary Examiner* — Dion R. Ferguson
(74) *Attorney, Agent, or Firm* — Young Law Firm, P.C.

(57) ABSTRACT

Disclosed herein a thin film capacitor that includes a lower electrode layer, an upper electrode layer, and a dielectric layer disposed between the lower electrode layer and the upper electrode layer. The lower electrode layer includes a first metal layer positioned on a side facing the dielectric layer and a second metal layer positioned on a side facing away from the dielectric layer. The first metal layer has a first surface positioned on a side facing the second metal layer and a second surface positioned on a side facing the dielectric layer. The first surface has a surface roughness higher than that of the second surface. The second metal layer reflects a surface property of the first surface.

20 Claims, 4 Drawing Sheets

(56) References Cited

U.S. PATENT DOCUMENTS

| | | | |
|---|---|---|---|
| 2013/0342960 A1* | 12/2013 | Saita | H01G 4/01 |
| | | | 361/305 |
| 2015/0060122 A1* | 3/2015 | Lee | H01G 4/12 |
| | | | 361/301.4 |
| 2017/0025324 A1* | 1/2017 | Yamaki | H01L 28/84 |
| 2019/0172642 A1* | 6/2019 | Yamazaki | H01G 4/18 |
| 2020/0135406 A1* | 4/2020 | Aburakawa | H05K 1/115 |
| 2021/0090803 A1* | 3/2021 | Kang | H01G 4/012 |
| 2021/0257164 A1* | 8/2021 | Hiraoka | H01G 4/33 |

* cited by examiner

| Peel Strength (kgf/cm) | | Surface roughness Rz of first surface 11a (μm) | | |
|---|---|---|---|---|
| | | 1 μm | 2 μm | 5 μm |
| Thickness T of second metal layer 12 T (μm) | 0 | 0.23 | 0.23 | 0.26 |
| | 0.5 | 0.34 | 0.34 | 0.36 |
| | 1 | 0.36 | 0.51 | 0.39 |
| | 1.5 | 0.33 | 0.55 | 0.54 |
| | 2 | 0.32 | 0.41 | 0.60 |
| | 5 | | 0.36 | 0.45 |
| | 8 | | | 0.39 |

THIN FILM CAPACITOR, CIRCUIT BOARD INCORPORATING THE SAME, AND THIN FILM CAPACITOR MANUFACTURING METHOD

BACKGROUND OF THE INVENTION

Field of the Invention

The present invention relates to a thin film capacitor and a circuit board incorporating the same and, more particularly, to a thin film capacitor having high adhesion to an insulating resin layer and a circuit board incorporating such a thin film capacitor. The present invention also relates to a manufacturing method for such a thin film capacitor.

Description of Related Art

A thin film capacitor embedded in a circuit board typically has a lower electrode layer made of Ni and an upper electrode layer made of Cu. However, Ni has low adhesion to resin, so that when this typical thin film capacitor is embedded in a circuit board, interfacial peeling is apt to occur between the lower electrode layer and an insulating resin layer. To solve this disadvantage, in a thin film capacitor described in JP 2010-27948A, a Cu layer having a thickness of about 5 µm is provided on the surface of the lower electrode layer of Ni and, further, the surface of the Cu layer is roughened to thereby enhance adhesion between the lower electrode layer and the insulating resin layer.

However, the roughening of the Cu layer is involved in the thin film capacitor described in JP 2010-27948A, so that the number of processes increases, and the thickness of the entire capacitor increases by the thickness of the Cu layer.

SUMMARY

It is therefore an object of the present invention to provide a thin film capacitor having high adhesion to an insulating resin layer and a circuit board incorporating such a thin film capacitor, capable of minimizing an increase in the number of processes and in the thickness of the entire structure. Another object of the present invention is to provide a manufacturing method for a thin film capacitor having such a feature.

A thin film capacitor according to the present invention includes a lower electrode layer, an upper electrode layer, and a dielectric layer disposed between the lower electrode layer and the upper electrode layer. The lower electrode layer includes a first metal layer positioned on the side facing the dielectric layer and a second metal layer positioned on the side facing away from the dielectric layer. The first metal layer has a first surface positioned on the side facing the second metal layer and a second surface positioned on the side facing the dielectric layer. The first surface has a surface roughness higher than that of the second surface. The second metal layer reflects the surface property of the first surface.

According to the present invention, the first surface of the first metal layer is roughened and covered with the second metal layer having such a small thickness as to reflect the surface property of the first surface, so that it is possible to enhance adhesion to an insulating resin layer without roughening the second metal layer. In addition, the second metal layer is very thin, thus minimizing an increase in the thickness of the entire structure.

In the present invention, the thickness of the second metal layer may be 0.1 times or more and 2.5 times or less a surface roughness Rz of the first surface. This can enhance adhesion to the insulating resin layer. In this case, the thickness of the second metal layer may be 0.3 times or more and 1 times or less the surface roughness Rz of the first surface. This can further enhance adhesion to the insulating resin layer. In particular, when the thickness of the second metal layer is set to 0.4 times or more and 0.75 times or less the surface roughness Rz of the first surface, adhesion to the insulating resin layer can still further be enhanced.

In the present invention, the first metal layer may be made of Ni, and the second metal layer may be made of Cu. This can achieve both heat resistance and adhesion.

A circuit board according to the present invention incorporates the above-described thin film capacitor. According to the present invention, high adhesion can be achieved between the lower electrode layer of the thin film capacitor and the insulating resin layer, making it possible to prevent interfacial peeling between them.

In the present invention, the thermal expansion coefficient of the second metal layer may lie between those of the first metal layer and the insulating resin layer contacting the second metal layer. This can relieve a stress caused due to a difference in thermal expansion coefficient.

A thin film capacitor manufacturing method according to the present invention includes: a first step of forming a dielectric layer on the surface of a lower electrode layer constituted by a first metal layer; a second step of forming an upper electrode layer on the surface of the dielectric layer; a third step of roughening a first surface of the first metal layer that is positioned on the side facing away from the dielectric layer; and a fourth step of forming, on the first surface, a second metal layer that reflects the surface property of the roughened first surface.

According to the present invention, the second metal layer having such a small thickness as to reflect the surface property of the roughened first surface, so that it is possible to enhance adhesion between the lower electrode layer and the insulating resin layer without roughening the second metal layer.

As described above, according to the present invention, there can be provided a thin film capacitor having high adhesion to an insulating resin layer and a circuit board incorporating such a thin film capacitor, capable of minimizing an increase in the number of processes and in the thickness of the entire structure. Further, according to the present invention, there can be provided a manufacturing method for a thin film capacitor having such a feature.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Hereinafter, a preferred embodiment of the present invention will be described in detail with reference to the accompanying drawings.

Figure 1:
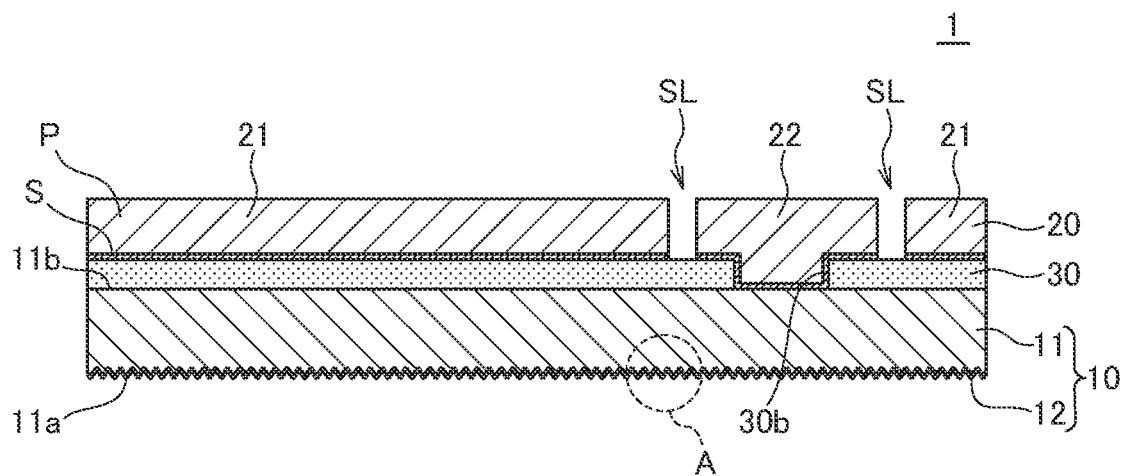
FIG. 1 is a schematic cross-sectional view for explaining the structure of a thin film capacitor 1 according to an embodiment of the present invention.

FIG. 1 is a schematic cross-sectional view for explaining the structure of a thin film capacitor 1 according to an embodiment of the present invention.

As illustrated in FIG. 1, the thin film capacitor 1 according to the present embodiment includes a lower electrode layer 10, an upper electrode layer 20, and a dielectric layer 30 disposed between the lower electrode layer 10 and the upper electrode layer 20. The lower electrode layer 10 contacts an insulating resin layer constituting a circuit board in a state where the thin film capacitor 1 according to the present embodiment is embedded in the circuit board. The lower electrode layer 10 includes a first metal layer 11 positioned on the side facing the dielectric layer 30 and a second metal layer 12 positioned on the side facing away from the dielectric layer 30. A first surface (one surface) 11a of the first metal layer 11 contacts the second metal layer 12, and a second surface (the other surface) 11b thereof contacts the dielectric layer 30.

The first metal layer 11 serves as a base for the thin film capacitor 1 and is made of, e.g., Ni (nickel). The reason that Ni is used as the material of the first metal layer 11 is that, as will be described later, the first metal layer 11 is used as a support body for the dielectric layer 30 in a process of baking the dielectric layer 30 and thus needs to have high temperature durability. The second metal layer 12 is made of, e.g., Cu (copper) and has a role of enhancing adhesion to the insulating resin layer in a state where the thin film capacitor 1 is embedded in the circuit board. The upper electrode layer 20 is made of, e.g., Cu and composed of a laminated film of a seed layer S and an electrolytic plating layer P. A thin Ni layer may be provided between the dielectric layer 30 and the upper electrode layer 20.

The dielectric layer 30 is formed using a perovskite dielectric material. Examples of the perovskite dielectric material include: a ferroelectric or dielectric material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, and $Pb(Zr_xTi_{1-x})O_3$; a complex perovskite relaxer ferroelectric material represented by, e.g., $Pb(Mg_{1/3}Nb_{2/3})O_3$; a bismuth layered compound represented by, e.g., $Bi_4Ti_3O_{12}$ and $SrBi_2Ta_2O_9$; and tungsten bronze ferroelectric material represented by, e.g., $(Sr_{1-x}Ba_x)Nb_2O_6$ and $PbNb_2O_6$. Meanwhile, a ratio of A site and B site in the perovskite structure, perovskite relaxer ferroelectric material, bismuth layered compound, and tungsten bronze ferroelectric material is typically an integral ratio; however, it is allowable to intentionally depart the ratio from the integral ratio to improve the characteristics. An additive can be appropriately added to the dielectric layer 30 as an accessory component to control the characteristics of the dielectric layer 30. The thickness of the dielectric layer 30 is, e.g., 10 nm to 1000 nm.

The upper electrode layer 20 has a ring-shaped slit SL formed therein and is divided thereby into an electrode part 21 and a connection part 22. The electrode part 21 functions as one capacitance electrode of the thin film capacitor 1 and faces, through the dielectric layer 30, the lower electrode layer 10 that functions as the other capacitance electrode of the thin film capacitor 1. The connection part 22 is connected to the lower electrode layer 10 through a through hole 30b formed in the dielectric layer 30 and thus has the same potential as the lower electrode layer 10. With this structure, electrical connection to the lower electrode layer 10 can be made from the upper electrode layer 20 side. In addition, since most part of the lower electrode layer 10 faces the electrode part 21 through the dielectric layer 30, a large capacitance can be obtained.

Figure 2:
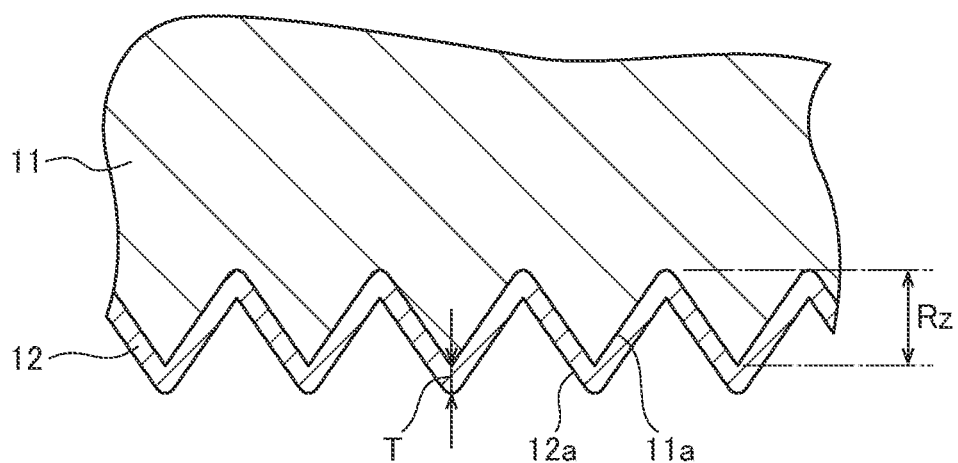
FIG. 2 is a schematic cross-sectional view illustrating an area A illustrated in FIG. 1 in an enlarged manner.

FIG. 2 is a schematic cross-sectional view illustrating an area A illustrated in FIG. 1 in an enlarged manner.

As illustrated in FIG. 2, the surface 11a of the first metal layer 11 is roughened and has a surface roughness higher than that of the surface 11b. Specifically, a surface roughness Rz of the surface 11a is preferably 1 μm or more. The surface roughness Rz is defined as 10-point average roughness specified in JIS B 0601: 1994. The second metal layer 12 is formed on the surface 11a of the first metal layer 11, and a thickness T thereof is set thin to such a degree as to reflect the surface property of the surface 11a of the first metal layer 11. That is, a surface 12a of the second metal layer 12 is also roughened.

Although the lower limit of the thickness T is not particularly limited, the thickness T is preferably 0.1 times or more the surface roughness Rz of the surface 11a, and more preferably 0.3 times or more. Further, although the upper limit of the thickness T is not also particularly limited, the thickness T is preferably 2.5 times or less the surface roughness Rz of the surface 11a, and more preferably 1 times or less. Particularly preferably, the thickness T is 0.4 times or more and 0.75 times or less the surface roughness Rz of the surface 11a. When the thickness T of the second metal layer 12 is too small, the surface 11a of the first metal layer 11 is not completely covered with the second metal layer 12 and may be partially exposed, which may deteriorate adhesion to the insulating resin layer; when the thickness T of the second metal layer 12 is too large, the surface 12a of the second metal layer 12 increases its flatness, which may deteriorate adhesion to the insulating resin layer. By setting the thickness T of the second metal layer 12 in the above range, the surface 11a of the first metal layer 11 is not exposed, and the second metal layer 12 has a sufficient surface roughness, thereby enhancing adhesion to the insulating resin layer.

Figure 3:
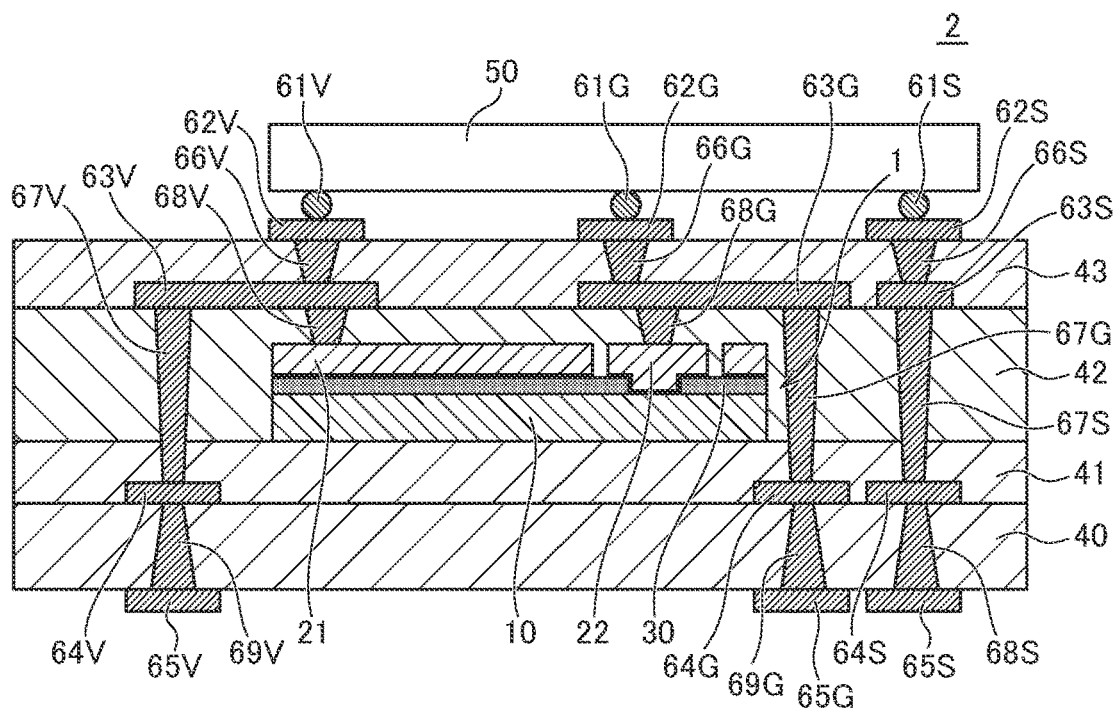
FIG. 3 is a schematic cross-sectional view of a circuit board 2 incorporating the thin film capacitor 1.

FIG. 3 is a schematic cross-sectional view of a circuit board 2 incorporating the thin film capacitor 1 according to the present embodiment.

In the circuit board 2 illustrated in FIG. 3, an insulating base 40 and insulating resin layers 41 to 43 are laminated, and the thin film capacitor 1 is embedded in the insulating resin layer 42. A semiconductor chip 50 is mounted on the upper surface of the circuit board 2. Further, the circuit board 2 is provided with power supply patterns 62V to 65V, ground patterns 62G to 65G, and signal patterns 62S to 65S. The power supply pattern 65V, ground pattern 65G, and signal pattern 65S each constitute an external terminal provided on the lower surface of the circuit board 2. The semiconductor chip 50, which is not particularly limited in type, has at least a power supply terminal 61V, a ground terminal 61G, and a signal terminal 61S. The terminals 61V, 61G, and 61S are connected to the power supply pattern 62V, ground pattern 62G, and signal pattern 62S, respectively.

The power supply pattern 62V is connected to the power supply pattern 63V through a via conductor 66V. The power supply pattern 63V is connected to the power supply pattern 64V through a via conductor 67V and to the electrode part 21 of the thin film capacitor 1 through a via conductor 68V. The power supply pattern 64V is connected to the power supply pattern 65V through a via conductor 69V. The ground pattern 62G is connected to the ground pattern 63G through a via conductor 66G. The ground pattern 63G is connected to the ground pattern 64G through a via conductor 67G and to the connection part 22 of the thin film capacitor 1 through a via conductor 68G. The ground pattern 64G is connected to the ground pattern 65G through a via conductor 69G.

With the above configuration, a power supply potential is given to one capacitance electrode (electrode part 21 of the upper electrode layer 20) of the thin film capacitor 1, and a ground potential is given to the other capacitance electrode (lower electrode layer 10), whereby a decoupling capacitor for the semiconductor chip 50 is constituted.

The signal pattern 62S is connected to the signal pattern 63S through a via conductor 66S. The signal pattern 63S is connected to the signal pattern 64S through a via conductor 67S. The signal pattern 64S is connected to the signal pattern 65S through a via conductor 68S.

The thin film capacitor 1 can be embedded in the circuit board 2 using a roll laminator. Specifically, after formation of the insulating resin layer 41 on the surface of the insulating base 40, the thin film capacitor 1 is laminated on the surface of the insulating resin layer 41 while rotating a roll. In this state, the lower electrode layer 10 of the thin film capacitor 1 contacts the insulating resin layer 41. In the present embodiment, the surface of the lower electrode layer 10 has the second metal layer 12 having higher adhesion to the insulating resin layer 41 than the first metal layer 11, and the surface property of the roughened surface 11a of the first metal layer 11 is reflected on the second metal layer 12, so that sufficient adhesion can be achieved between the lower electrode layer 10 and the insulating resin layer 41.

In particular, when a material having a thermal expansion coefficient which lies between those of the first metal layer 11 and the insulating resin layer 41 is used as a material for the second metal layer 12, a stress caused due to a difference in thermal expansion coefficient is relieved, making it less likely to cause interfacial peeling between the lower electrode layer 10 and the insulating resin layer 41. For example, the thermal expansion coefficient of Ni is 13.3 ppm/° C., and the thermal expansion coefficient of Cu is 16.5 ppm/° C., so that when a resin material having a thermal expansion coefficient of about 20 ppm/° C. is used as a material for the insulating resin layer 41, the second metal layer 12 made of Cu serves as a buffer, thus making it less likely to cause interfacial peeling between the lower electrode layer 10 and the insulating resin layer 41.

The following describes a manufacturing method for the thin film capacitor 1 according to the present embodiment.

FIGS. 4 to 9 are process views for explaining a manufacturing method for the thin film capacitor 1 according to the present embodiment.

Figure 4:
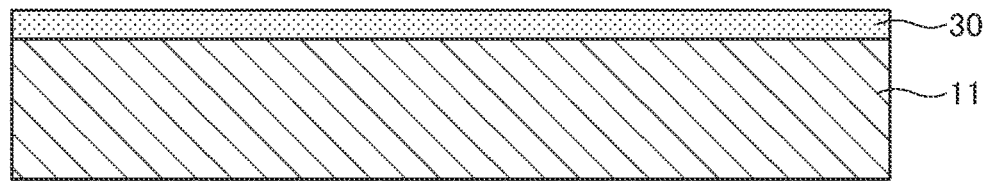
FIGS. 4 to 8 are process views for explaining a manufacturing method for the thin film capacitor 1.
Figure 5:
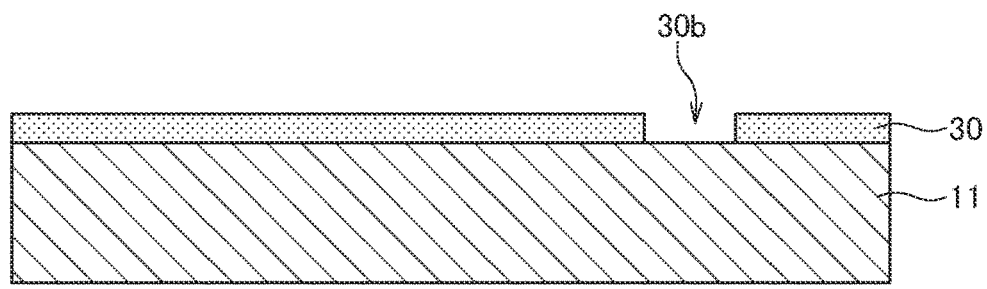

As illustrated in FIG. 4, the first metal layer 11 made of Ni and having a thickness of about 15 μm is prepared, and the dielectric layer 30 made of, e.g., barium titanate is formed on the surface of the first metal layer 11 and baked. Although the first metal layer 11 is subjected to high temperature at this time, it can endure the baking temperature due to being made of high-meting point metal such as Ni. Then, as illustrated in FIG. 5, the dielectric layer 30 is patterned to form the through hole 30b therein. The surface of the first metal layer 11 is exposed at the formation area of the through hole 30b.

Figure 6:
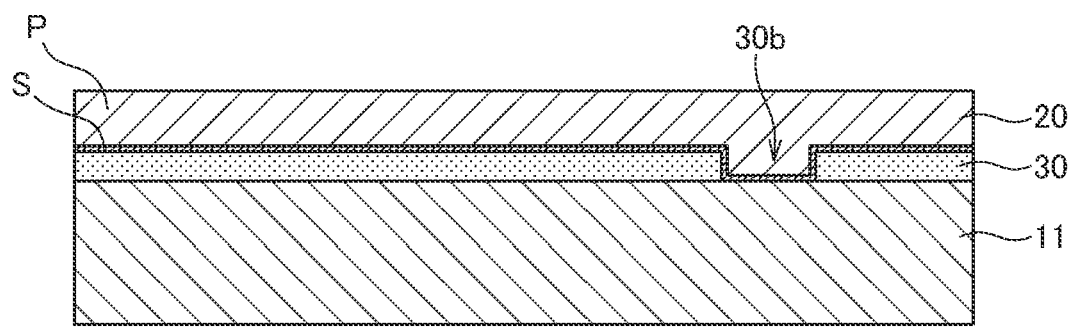

Then, as illustrated in FIG. 6, the upper electrode layer 20 is formed on the surface of the dielectric layer 30 including the through hole 30b. The upper electrode layer 20 can be obtained by forming the seed layer S in small thickness using sputtering or electroless plating and then by performing electrolytic plating using the seed layer S as a feeder. Thus, the upper electrode layer 20 composed of a laminated body of the thin seed layer S and thick electrolytic plating layer P is formed. Although the upper electrode layer 20 and the first metal layer 11 contact each other in the through hole 30b, sufficient adhesion is provided between them since the surface of the first metal layer 11 has been roughened in the previous formation process of the through hole 30b.

Figure 7:
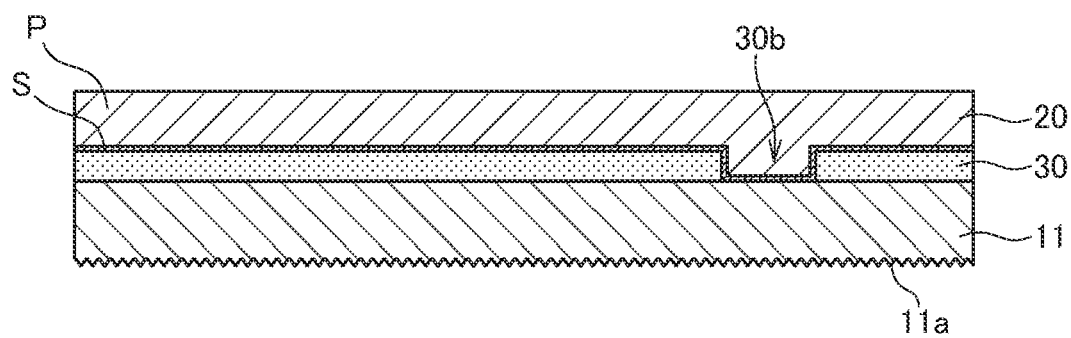
Figure 8:
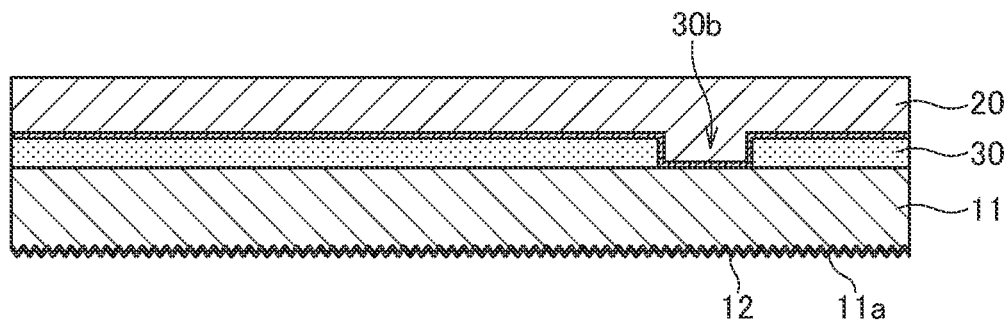

Then, as illustrated in FIG. 7, etching is performed to reduce the thickness of the first metal layer 11 to, e.g., about 10 μm. In this process, the surface 11a of the first metal layer 11 is roughened through etching. Subsequently, as illustrated in FIG. 8, the second metal layer 12 made of, e.g., Cu is formed on the surface 11a of the first metal layer 11. The second metal layer 12 can be formed using, e.g., sputtering. As described above, the thickness of the second metal layer 12 needs to be set thin to such a degree as to reflect the surface property of the surface 11a of the first metal layer 11. This allows the surface of the second metal layer 12 to be roughened without applying surface roughening treatment such as etching to the second metal layer 12.

Then, as illustrated in FIG. 1, the upper electrode layer 20 is patterned to form the slit SL. As a result, the electrode part 21 and the connection part 22 are insulated and isolated from each other by the slit SL, whereby the thin film capacitor 1 according to the present embodiment illustrated in FIG. 1 is completed.

As described above, in the present embodiment, the first metal layer 11 as a base is made thin by etching, and then the thin second metal layer 12 is formed on the surface 11a of the first metal layer 11. This allows the surface of the second metal layer 12 to be roughened without applying surface roughening treatment such as etching to the second metal layer 12. Thus, it is possible to achieve sufficient adhesion to the insulating resin layer 41 in a state where the thin film capacitor 1 is embedded in the circuit board 2 while minimizing an increase in the number of processes.

It is apparent that the present invention is not limited to the above embodiments, but may be modified and changed without departing from the scope and spirit of the invention.

EXAMPLES

Figures 9, 10:
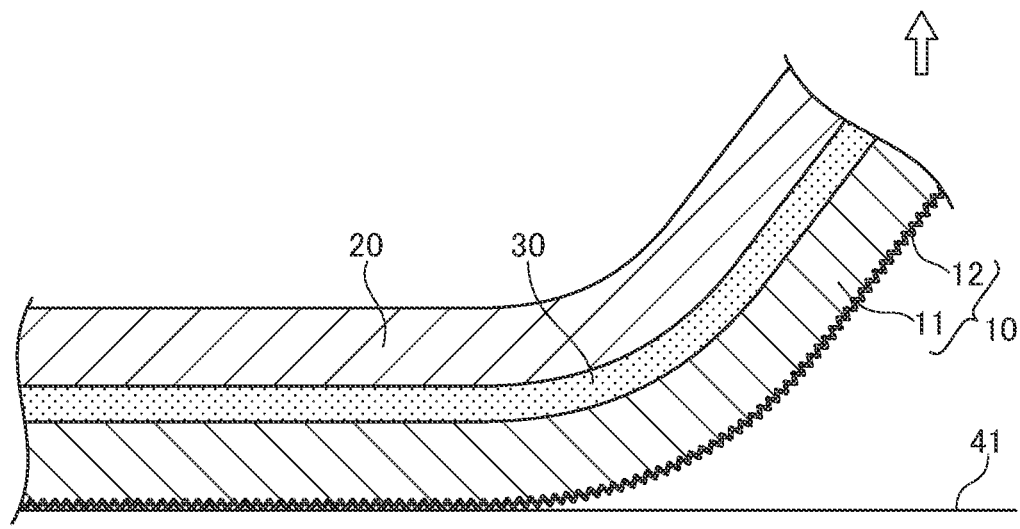
FIG. 9 is a schematic diagram for explaining a method of a peel test.
FIG. 10 is a table for indicating a result if the peel test.

There were fabricated samples having the same layer structure as that illustrated in FIG. 1 except that the through hole 30b and slit SL were omitted. Then, as illustrated in FIG. 9, each sample was attached to the insulating resin layer 41, followed by peeling (peel test). In these samples, Ni having a 10 μm thickness was used for the first metal layer 11 constituting the lower electrode layer 10, Ni having a 0.5 μm thickness and Cu having a 10 μm thickness were for the upper electrode layer 20, and barium titanate having a 0.6 μm thickness was for the dielectric layer 30. For the second metal layer 12, Cu films having different thicknesses were used for respective samples. The surface roughness Rz of the surface 11a of the first metal layer 11 was set to 1 μm, 2 μm, or 5 μm. The insulating base 40 was constituted using a glass epoxy substrate (thickness: 600 μm), and the insulating resin layer 41 was formed of epoxy resin (thickness: 25 μm) including filler.

Then, the insulating resin layer 41 was laminated onto the surface of the insulating base 40 at 100° C. and 0.5 MPa over a 30 second period. Further, a sample of a thin film capacitor having a 10 mm×100 mm size was laminated on the surface of the insulating resin layer 41 at 100° C. and 0.5 MPa over a 30 second period, followed by curing at 200° C. for 60 minutes. Thereafter, as illustrated in FIG. 9, peel test was performed to peel the thin film capacitor sample from the insulating resin layer 41 at a speed of 15 mm/min. The peel test was performed for four identical samples (N=4), and the average value of peel strength values was determined.

The results are shown in FIG. 10. As shown in FIG. 10, in the absence of the second metal layer 12 (thickness T=0 μm), the peel strength was 0.23 kgf/cm to 0.26 kgf/cm, whereas in the presence of the second metal layer 12 made of Cu, the peel strength increased to 0.34 kgf/cm or more. Specifically, in the case where the surface roughness Rz of the surface 11a was 5 μm, the peel strength increased by 0.10 kgf/cm by providing the second metal layer 12 having a thickness T of 0.5 μm (=0.1 Rz). Further, in the case where the surface roughness Rz of the surface 11a was 2 μm, the peel strength increased by 0.13 kgf/cm by providing the second metal layer 12 having a thickness T of 5.0 μm (=2.5 Rz).

In the case where the surface roughness Rz of the surface 11a was 1 μm, the peel strength was particularly high when the thickness T of the second metal layer 12 was 0.5 μm (=0.5 Rz) or more and 1.0 μm (=1 Rz) or less and became highest when the thickness T was 1.0 μm (=1 Rz). In the case where the surface roughness Rz of the surface 11a was 2 μm, the peel strength was particularly high when the thickness T of the second metal layer 12 was 1.0 μm (=0.5 Rz) or more and 2.0 μm (=1 Rz) or less and became highest when the thickness T was 1.5 μm (=0.75 Rz). In the case where the surface roughness Rz of the surface 11a was 5 μm, the peel strength was particularly high when the thickness T of the second metal layer 12 was 1.5 μm (=0.3 Rz) or more and 5.0 μm (=1 Rz) or less and became highest when the thickness T was 2.0 μm (=0.4 Rz).

What is claimed is:

1. A thin film capacitor comprising:
   a lower electrode layer;
   an upper electrode layer; and
   a dielectric layer disposed between the lower electrode layer and the upper electrode layer,
   wherein the lower electrode layer includes a first metal layer positioned on a side facing the dielectric layer and a second metal layer positioned on a side facing away from the dielectric layer,
   wherein the first metal layer has a first surface positioned on a side facing the second metal layer and a second surface positioned on a side facing the dielectric layer,
   wherein the first surface has a surface roughness higher than that of the second surface, and
   wherein the second metal layer is lower in surface roughness than the first surface to an extent that the second metal layer reflects a surface property of the first surface.

2. The thin film capacitor as claimed in claim 1, wherein a thickness of the second metal layer is 0.1 times or more and 2.5 times or less a surface roughness Rz of the first surface.

3. The thin film capacitor as claimed in claim 2, wherein the thickness of the second metal layer is 0.3 times or more the surface roughness Rz of the first surface.

4. The thin film capacitor as claimed in claim 2, wherein the thickness of the second metal layer is 1 times or less the surface roughness Rz of the first surface.

5. The thin film capacitor as claimed in claim 1, wherein a thickness of the second metal layer is 0.4 times or more and 0.75 times or less the surface roughness Rz of the first surface.

6. The thin film capacitor as claimed in claim 1, wherein the first metal layer comprises Ni and the second metal layer comprises Cu.

7. A circuit board incorporating a thin film capacitor, the thin film capacitor comprising:
   a lower electrode layer;
   an upper electrode layer; and
   a dielectric layer disposed between the lower electrode layer and the upper electrode layer,
   wherein the lower electrode layer includes a first metal layer positioned on a side facing the dielectric layer and a second metal layer positioned on a side facing away from the dielectric layer,
   wherein the first metal layer has a first surface positioned on a side facing the second metal layer and a second surface positioned on a side facing the dielectric layer,
   wherein the first surface has a surface roughness higher than that of the second surface, and
   wherein the second metal layer is lower in surface roughness than the first surface to an extent that the second metal layer reflects a surface property of the first surface.

8. The circuit board as claimed in claim 7,
   wherein the circuit board includes an insulating resin layer contacting the second metal layer, and
   wherein a thermal expansion coefficient of the second metal layer lies between those of the first metal layer and the insulating resin layer.

9. A method of manufacturing a thin film capacitor, the method comprising:
   forming a dielectric layer on a surface of a lower electrode layer constituted by a first metal layer;
   forming an upper electrode layer on a surface of the dielectric layer;
   roughening a first surface of the first metal layer that is positioned on a side facing away from the dielectric layer; and
   forming, on the first surface, a second metal layer having a surface roughness that is lower in surface roughness than the first surface to an extent that the second metal layer reflects a surface property of the roughened first surface.

10. The thin film capacitor as claimed in claim 1,
    wherein the upper electrode layer is divided into an electrode part and a connection part by a slit,
    wherein the dielectric layer includes a through hole, and
    wherein the connection part of the upper electrode layer is connected to the lower electrode layer via the through hole.

11. The thin film capacitor as claimed in claim 10, wherein the connection part is surrounded by the slit.

12. The thin film capacitor as claimed in claim 11, wherein the slit is ring-shaped.

13. The thin film capacitor as claimed in claim 10, wherein the upper electrode layer includes a seed layer contacts with the dielectric layer and a plating layer formed on the seed layer.

14. The thin film capacitor as claimed in claim 13, wherein the seed layer further contacts with an inner wall of the through hole and a part of the second surface of the lower electrode layer overlapping the through hole.

15. The circuit board as claimed in claim 7, further comprising:

a first insulating resin layer having a first main surface; and a second insulating resin layer having a second main surface and stacked on the first insulating resin layer such that the second main surface of the second insulating resin layer contacts with the first main surface of the first insulating resin layer, wherein the thin film capacitor is mounted on the first insulating resin layer such that the second metal layer contacts with the first main surface of the first insulating resin layer, and wherein the thin film capacitor is embedded in the second insulating resin layer.

16. The circuit board as claimed in claim 15, wherein the second metal layer entirely contacts with the first main surface of the first insulating resin layer.

17. The circuit board as claimed in claim 16, further comprising first and second via conductors embedded in the second insulating resin layer, wherein the upper electrode layer is divided into an electrode part and a connection part by a slit, wherein the dielectric layer includes a through hole, wherein the connection part of the upper electrode layer is connected to the lower electrode layer via the through hole, wherein the first via conductor contacts with the electrode part of the upper electrode layer, and wherein the second via conductor contacts with the connection part of the upper electrode layer.

18. The method as claimed in claim 9, further comprising:

patterning the dielectric layer to form a through hole therein before the forming the upper electrode layer; and patterning the upper electrode layer to form a slit that divides the upper electrode layer into an electrode part isolated from the lower electrode layer and a connection part connected to the lower electrode layer.

19. The method as claimed in claim 18, wherein the patterning the upper electrode layer is performed after the roughening.

20. The method as claimed in claim 19, wherein the patterning the upper electrode layer is performed after the forming the second metal layer.

* * * * *